(12) United States Patent
Uchino

(10) Patent No.: US 6,272,663 B1
(45) Date of Patent: Aug. 7, 2001

(54) SYSTEM AND METHOD FOR REDUCING UNDESIRED RADIATION GENERATED BY LSI

(75) Inventor: Taku Uchino, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/312,828

(22) Filed: May 17, 1999

(30) Foreign Application Priority Data

May 18, 1998 (JP) .................................................. 10-135095

(51) Int. Cl.⁷ ...................................................... G06F 17/50
(52) U.S. Cl. ............................................................. 716/2
(58) Field of Search ................................ 716/1, 2, 19, 20

(56) References Cited

U.S. PATENT DOCUMENTS 5,559,997 * 9/1996 Tsuchida et al. ......................... 716/1

* cited by examiner

Primary Examiner—Trong Phan
(74) Attorney, Agent, or Firm—Foley & Lardner

(57) ABSTRACT

A system for reducing undesired radiation generated from an LSI, comprises: a first storage part 2 for storing a circuit connection information for the LSI and a current waveform of an undesired radiation source of the LSI; a transfer function calculating part 6 for calculating a transfer function of undesired radiation, which is transmitted from an undesired radiation source in the LSI to a power source terminal connected to the outside of the LSI, on the basis of the circuit connection information and the current waveform; a second storage part 4 for storing a constraint on an impedance added in the vicinity of the undesired radiation source, and an allowable level of undesired radiation at the power source terminal; and an undesired radiation optimizing part 8 for calculating an impedance, which causes the undesired radiation at the power source terminal to be less than or equal to the allowable level, using the transfer function under the constraint. Thus, undesired radiation generated from the LSI is reduced.

7 Claims, 5 Drawing Sheets

SYSTEM AND METHOD FOR REDUCING UNDESIRED RADIATION GENERATED BY LSI

BACKGROUND OF THE INVENTION

1. Field of the Invention

The present invention relates generally to a system and method for reducing undesired radiation generated from LSIs. More specifically, the invention relates to an undesired radiation reducing system and method for use in automated design for LSIs.

2. Description of Related Arts

As undesired radiation (which will be also hereinafter referred to as a "noise") generated from LSIs, the following three kinds of noises shown in FIG. 7 are typically known.
(1) Power Source Noise: Swing in potential of power source lines 41a, 41b due to power consumption in an LSI circuit 40.
(2) I/O Noise: Swing in potential of power source lines 41a, 41b propagated to an output signal of an input-output buffer 44.
(3) Electromagnetic Radiation Noise (Radiation Noise): Electromagnetic wave radiated from the whole surface of a chip 40.

Main noise sources are circuit elements relating to clock signals (which will be also hereinafter referred to as "clock cells"), such as a flip-flop 42 or a clock buffer. Since the clock signals are synchronism with each other, currents flow simultaneously through the clock cells. Since an LSI has numerous clock cells, the total current is great. Therefore, a great number of charges are drawn out of power source lines in a short time. In order to compensate the charges drawn out of the power source lines, it is required to supply with charges from the outside of the circuit. The flow of the supplied charges serves as a power source noise observed outside the LSI.

As a method for reducing a power source noise, there is known a method for adding a capacitor to a power source line in the vicinity of a noise source. The reason why this method can reduce the power source noise is as follows. The added capacitor serves as a charge storage area. Thus, a part or a large part of current to be consumed by the noise source can be temporarily supplied from the added capacitor. Therefore, it is not required to supply charges from the outside of the LSI in a short time, so that the power source noise is reduced.

However, it is generally difficult to determine the dimension of the capacitor to be added. If the capacitor is inadvertently added, there is a possibility that the added capacitor is combined with an inductance in the circuit to cause resonance (a state of a very large noise). In addition, an addable capacitor is restricted for the following two reasons.
(1) Holding of Reliability of LSI The capacitor in the LSI is formed of an oxide film. This oxide film is very thin, so that it is breakable. Therefore, as the number of capacitors increases, the area of the oxide films increases, so that there is a higher probability that the LSI will fail.
(2) Constraint on Available Capacitor Circuit elements are spread all over the interior of an LSI in order to increase the degree of integration of the LSI. Thus, the area occupied by the capacitor in the vicinity of a certain noise source is restricted.

It is required to obey the aforementioned two constraints and to add capacitors so as not to cause resonance. It is very difficult to do so by the engineer's manual operation. Therefore, it is required to provide a system for automatically calculating a capacity to be added. However, such a system is not known in the present circumstances.

SUMMARY OF THE INVENTION

It is therefore an object of the present invention to eliminate the aforementioned problems and to provide an undesired radiation reducing system and method, which can reduce undesired radiation generated from an LSI.

In order to accomplish the aforementioned and other objects, according to one aspect of the present invention, there is provided a system for reducing undesired radiation generated from an LSI, the system comprising: first storage means for storing a circuit connection information for the LSI and a current waveform of an undesired radiation source of the LSI; transfer function calculating means for calculating a transfer function of undesired radiation, which is transmitted from an undesired radiation source in the LSI to a power source terminal connected to the outside of the LSI, on the basis of the circuit connection information and the current waveform; second storage means for storing a constraint on an impedance added in the vicinity of the undesired radiation source, and an allowable level of undesired radiation at the power source terminal; and undesired radiation optimizing means for calculating an impedance, which causes the undesired radiation at the power source terminal to be less than or equal to the allowable level, using the transfer function under the constraint.

The impedance added in the vicinity of the undesired radiation source is preferably a capacitor.

Preferably, the undesired radiation optimizing means derives a relationship between a current vector of the undesired radiation source and a current vector flowing through the power source terminal, and derives undesired radiation so that an objective function, which is an absolute value of the current vector flowing through the power source terminal, is minimum under the constraint.

Preferably, the undesired radiation optimizing means derives a differential of the objective function with respect to the added capacitor, and derives undesired radiation so that the differential is minimum under the constraint.

The differential may be weighted by a weighting factor determined by the allowable level.

According to another aspect of the present invention, there is provided a method for reducing undesired radiation generated from an LSI, the method comprising: a first step of deriving a transfer function of undesired radiation, which is transmitted from an undesired radiation source in the LSI to a power source terminal connected to the outside of the LSI, on the basis of a circuit connection information for the LSI and a current waveform of the undesired radiation source of the LSI; a second step of setting a constraint on an impedance added in the vicinity of the undesired radiation source, an allowable level of undesired radiation at the power source terminal, and a frequency range to be considered; a third step of deriving undesired radiation at the power source terminal under the constraint; a fourth step of determining whether the undesired radiation derived at the third step is not higher than the allowable level in the frequency range; and a fifth step of changing the added impedance so as to reduce the undesired radiation to repeat the third and fourth steps when the derived undesired radiation exceeds the allowable level, and outputting the added impedance when the derived undesired radiation is not higher than the allowable level.

The impedance added in the vicinity of the undesired radiation source is preferably a capacitor.

BRIEF DESCRIPTION OF THE DRAWINGS

The present invention will be understood more fully from the detailed description given hereinbelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

Figure 1:
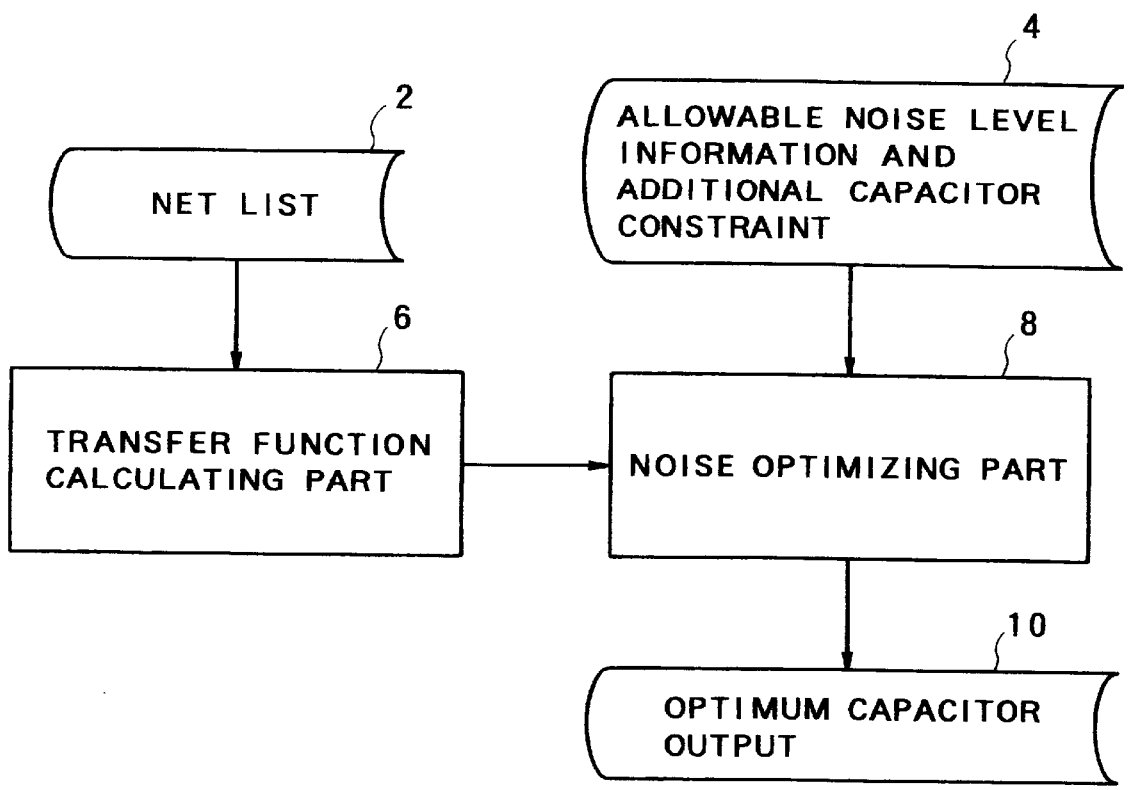
FIG. 1 is a block diagram showing the construction of an undesired radiation reducing system according to the present invention.

FIG. 1 shows a preferred embodiment of an undesired radiation reducing system for an LSI according to the present invention. In this preferred embodiment, the undesired radiation reducing system comprises storage parts 2, 4, a transfer function calculating part 6, a noise optimizing part 8 and an output part 10.

In the storage part 2, LSI circuit connection information called a net list, and a power source waveform of a noise source are stored. In the storage part 4, allowable noise level information set by input means (not shown), and additional capacitor constraints are stored.

The transfer function calculating part 6 is designed to calculate a transfer function, which will be described later, on the basis of the net list and so forth. The noise optimizing part 8 is designed to derive an optimum capacity on the basis of the transfer function, the allowable noise level information and the additional capacitor constraints to output the derived optimum capacity via the output part 10.

The operation of this preferred embodiment will be described below.

It is an object of this preferred embodiment to predict and reduce the power source noise of the aforementioned three kinds of noises (power source noise, I/O noise, radiation noise). Since the noise source of each of the three kinds of noises is the same, it is expected that the I/O noise and the radiation noise will be decreased by the reduction of the power source noise.

The operation of this preferred embodiment will be divided into four stages to be described below. Assumed matters will be described in the first stage, and the prediction for noises will be described in the second stage. The objective functions and constrains for optimizing noises will be described in the third stage, and the optimization for noises will be described in the fourth stage.

First of all, the assumed matters will be described.

In this preferred embodiment, noise sources are regarded as current sources, and current sources other than the noise sources are disregarded. It is also assumed that a power source line serving as a propagation path is a linear circuit comprising an inductance, a resistor and a capacitor. On the basis of such predictions, the circuit theory can be applied to the prediction for noises. Furthermore, it will be hereinafter assumed that the number of noise sources be m and the number of power sources be n.

Secondly, the prediction for power source noises using the circuit theory will be described.

Figure 3:
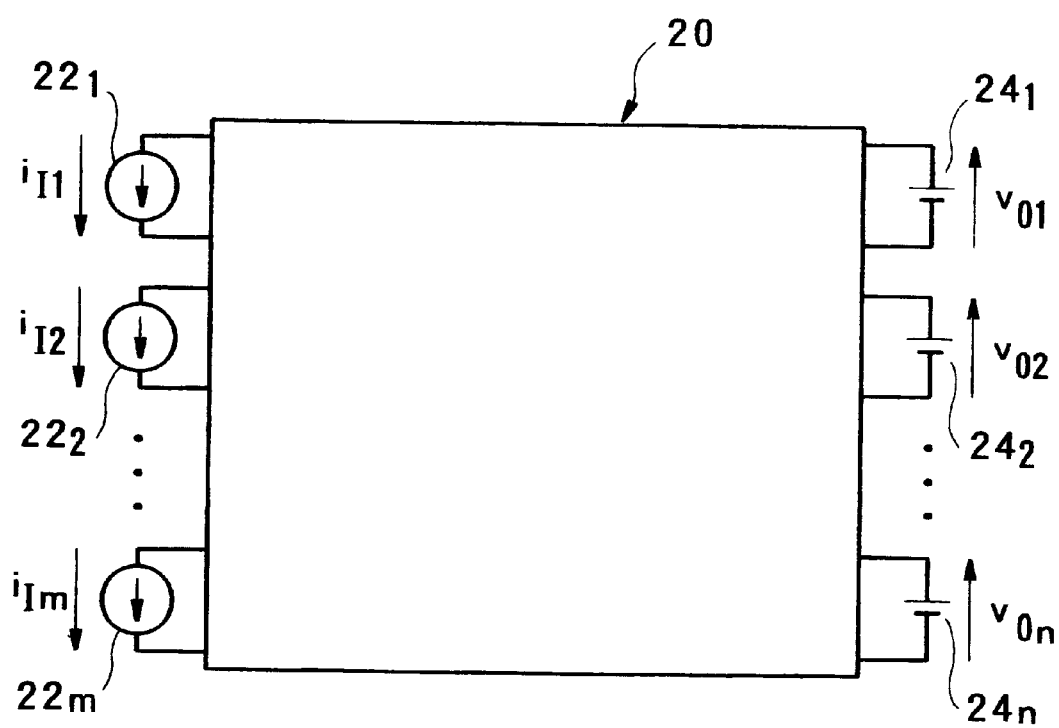
FIG. 3 is a schematic diagram of an LSI, to which the present invention is applied.

It is assumed that a current flowing through a k-th noise source is $i_{Ik}$, a voltage between power source terminals of the k-th noise source is $v_{Ik}$, a current flowing through a k-th power source is $i_{Ok}$, and a voltage of the k-th power source is $V_{Ok}$. It is however assumed that the currents and voltages have been Fourier-transformed. As shown in FIG. 3, the whole circuit is a multiterminal circuit which uses noise sources $22_1, \ldots, 22_m$ and power sources $24_1, \ldots, 24_n$ as terminals. This multiterminal circuit is a linear circuit which consists of linear electric elements (inductance, resistor, capacitor). The following formula (1) is established between the currents and voltages of the noise sources and the currents and voltages of the power sources via the multiterminal circuit.

$$\begin{bmatrix} \vec{v_I} \\ \vec{i_0} \end{bmatrix} = \begin{bmatrix} H_{II} & H_{I0} \\ H_{0I} & H_{00} \end{bmatrix} \begin{bmatrix} \vec{i_I} \\ \vec{v_0} \end{bmatrix} \quad (1)$$

wherein vectors $v_I$, $i_I$, $v_0$, $i_0$ denote voltages and currents represented by vectors. For example, a k-th component of the vector $v_I$ is $v_{Ik}$. In addition, $H_{II}$ denotes an m×m matrix, $H_{I0}$ denotes an m×n matrix, $H_{0I}$ denotes an n×m matrix, and $H_{00}$ denotes an n×n matrix. The elements of $H_{II}$, $H_{I0}$, $H_{0I}$ and $H_{00}$ are rational functions of s, and $H_{II}$, $H_{I0}$, $H_{0I}$ and $H_{00}$ are called transfer functions.

Furthermore, the derivation of the formula (1) is described in a literature 1 (L. O. CHUA et al., "Linear and Nonlinear Circuits", Mcgraw-Hill, 1987, ISBN 0-07-010898-6).

Since a large scale LSI has many circuit elements, it is required to approximate the transfer functions $H_{II}$, $H_{I0}$, $H_{0I}$ and $H_{00}$. Such an approximation is described in a literature 2 (Elichiprout et al., "Asymptotic Waveform Evaluation", Kluwer Academic Publishers, ISBN 0-7923-9413-5, 1994).

These transfer functions are calculated by the transfer function calculating part 5 on the basis of a net list or the like.

Using the formula (1), it is possible to predict a power source vector $i_0$ on the basis of the noise source current vector $i_I$ and power source vector $v_0$ which are known values.

Thirdly, the objective functions and constraints for optimizing the power source noises will be described.

Figure 4:
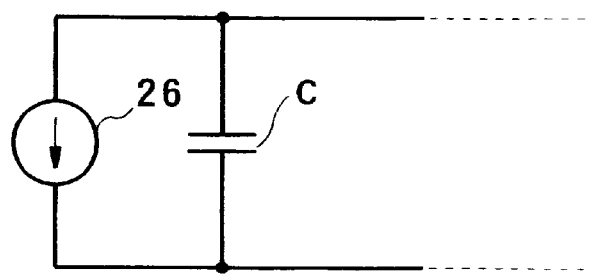
FIG. 4 is a circuit diagram showing the position of an additional capacitor for reducing noises.

If capacitors are provided in the vicinity of noise sources as shown in FIG. 4, the vector $i_I$ can be expressed by the following formula (2).

$$\vec{i_I} = \vec{j} + sC\vec{v_I} \quad (2)$$

wherein assuming that ω is an angular frequency, $s = (-1)^{1/2} \cdot \omega$, the vector j denotes a current vector of a noise source, and C denotes an m×m diagonal matrix, the diagonal component $C_{kk}$ (k=1, . . . , m) of which is a capacitor added to a k-th noise source.

If the formula (2) is substituted for the formula (1), the relationship between the currents and voltages of noise sources and the currents and voltages of power sources can be expressed by the following formula (3).

$$\begin{bmatrix} \vec{v_I} \\ \vec{i_0} \end{bmatrix} = \begin{bmatrix} (1-sH_{II}C)^{-1}H_{II} & (1-sH_{II}C)^{-1}H_{I0} \\ H_{0I}(1-sCH_{II})^{-1} & H_{00}+sH_{0I}C(1-sH_{II}C)^{-1}H_{I0} \end{bmatrix} \begin{bmatrix} \vec{j} \\ \vec{v_0} \end{bmatrix} \quad (3)$$

The difference between the formulae (1) and (3) is the presence or absence of additional capacitors C. In practice, the formula (1) can be obtained by putting C=0 in the formula (3).

From the formula (3), the relationship between the noise source current vector j and the power source current vector $i_0$ can be obtained (see the following formula (4)).

$$\vec{i_0} = H_{0I}(1-sCH_{II})^{-1}\vec{j} \quad (4)$$

Since the power source voltage is dc current, the formula (4) is derived on the basis of the fact that a Fourier component of a frequency other than 0 is 0 (see the following formula (5)).

$$\vec{v_0}(s \neq 0) = 0 \quad (5)$$

The square of the absolute value of the formula (4) is an objective function f for optimizing noises. This objective function can be expressed by the following formula (6).

$$f = |\vec{i_0}|^2 = \vec{j}^+(1+sH_{II}^+C)^{-1}H_{0I}^+H_{0I}(1-sCH_{II})^{-1}\vec{j} \quad (6)$$

wherein "+" denotes an Hermite conjugate. The Hermite conjugate matrix of a certain matrix A can be obtained by deriving a complex conjugate of a transposed matrix of the matrix A. That is:

$$A^+ = (A^T)^* \quad (7)$$

wherein "T" denotes a transposition of a matrix, and "*" denotes a complex conjugate.

The noise is smaller as the objective function f is smaller. Therefore, it is an object to derive a diagonal matrix C, by which the minimum value of the objective function f is given. However, there are the following restrictions on the diagonal matrix C as described in the prior art.

(a) Holding of Reliability of LSI

The capacitor in the LSI is formed of an oxide film. This oxide film is very thin, so that it is breakable. Therefore, as the number of capacitors increases, the area of the oxide film increases, so that there is a higher probability that the LSI will fail.

(b) Constraint on Available Capacitor

Circuit elements are spread all over the interior of an LSI in order to increase the degree of integration of the LSI. Thus, the area occupied by a capacitor in the vicinity of a certain noise source is restricted.

The restriction (a) is a restriction on all of addable capacitors. This can be expressed by the following formula (8).

$$\sum_{a=1}^{m} C_a \leq C_{max} \quad (8)$$

wherein m denotes the number of noise sources, $C_a$ denotes a capacity added to an a-th noise source, and $C_{max}$ denotes the maximum value of all of addable capacities.

The restriction (b) is a restriction on the capacitor which can be added to a certain noise source. This can be expressed by the following formula (9).

$$C_a \leq C_{a,amx}(a=1, 2, \ldots, m) \quad (9)$$

wherein $C_a$ denotes a capacitor added to an a-th noise source, and $C_{a,amx}$ denotes the maximum value of capacities which can be added to the a-th noise source.

In view of the foregoing, if the objective function f is minimized on the conditions of the formulae (8) and (9), it is possible to reduce noises.

Fourthly, a noise optimizing method will be specifically described. In order to describe the noise optimizing method, two simple examples will be taken.

A first example will be described.

Figure 5:
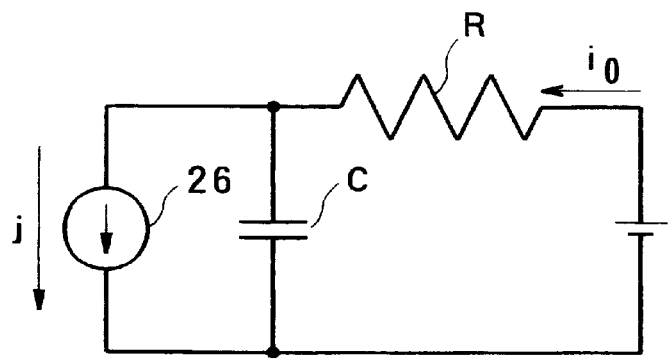
FIG. 5 is a circuit diagram when a single resistor is provided in a transfer path.

In this example, the number of noise sources is m=1, the number of power sources is n=1, and a circuit for transmitting noises comprises a single resistor (value R), as shown in FIG. 5. In this case, the objective function f can be expressed by the following formula (10).

$$f = (1+\omega^2 C^2 R^2)^{-1}|j|^2 \quad (10)$$

In the formula (10), vector notation is omitted since a power source j for a noise source is one. As the capacity C is greater, the objective function f is smaller. Therefore, if the maximum C meeting the conditions of the formulae (8) and (9) is added to the noise source, the noise is optimized. However, the noise is not always optimized as the capacity C is greater in different circuits. This will be described in a second example.

Figure 6:
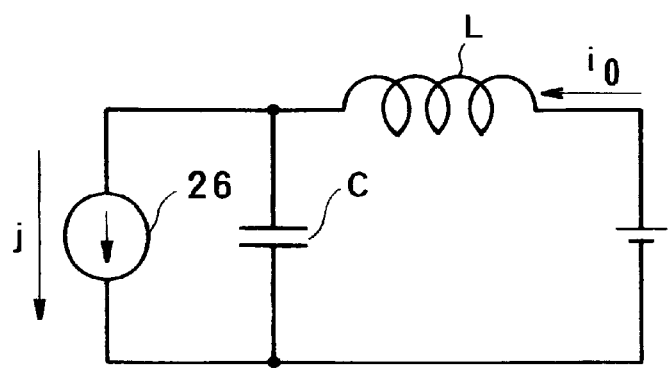
FIG. 6 is a circuit diagram when a single inductance is provided in a transfer path.
Figure 7:
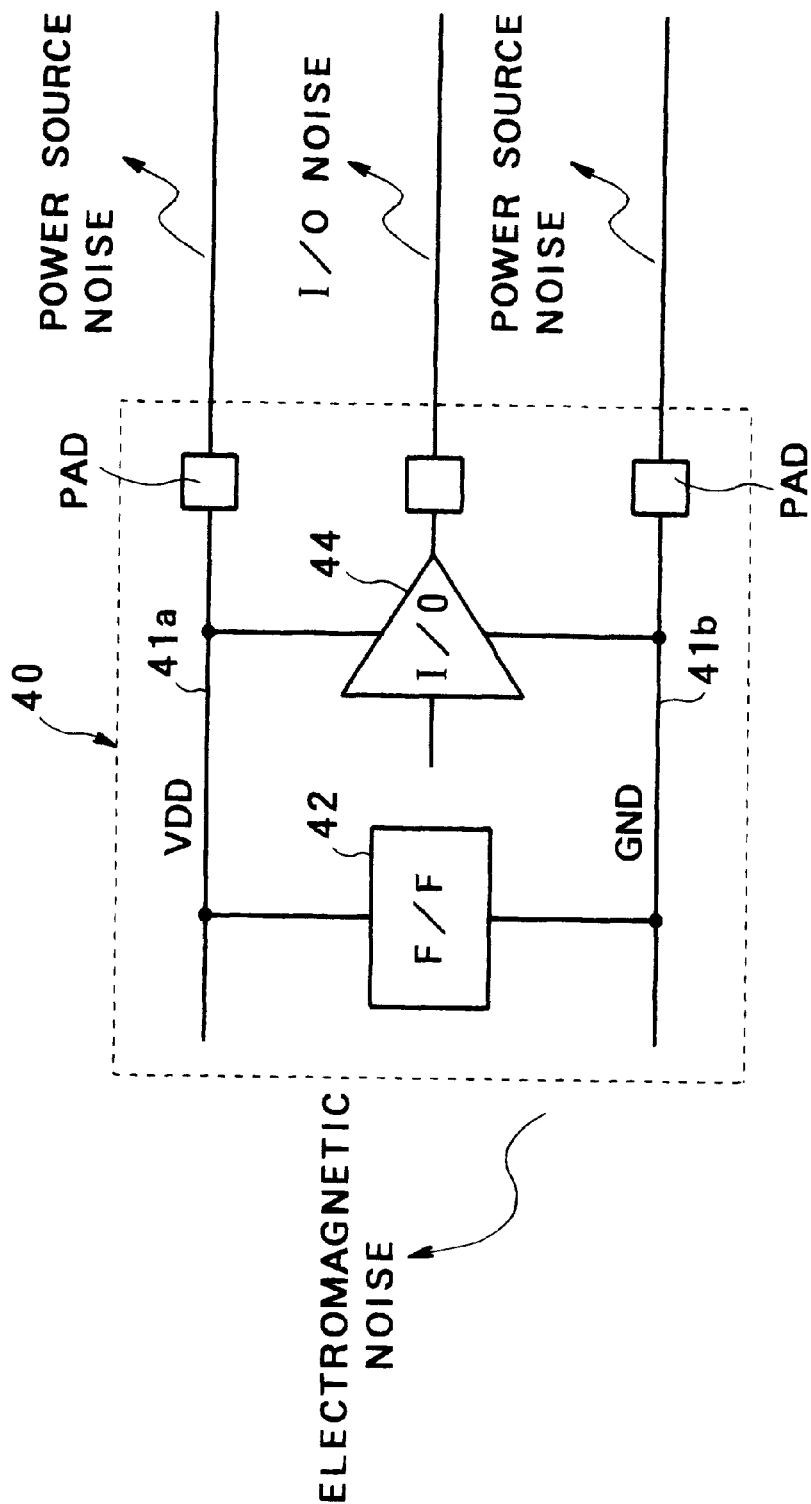
FIG. 7 is a schematic diagram for explaining the kinds of noises generated from an LSI.

In the second example, the number of noise sources is m=1, the number of power sources is n=1, and a circuit for transmitting noises comprises a single inductance (value L) (see FIG. 6). In this case, the objective function f can be expressed by the following formula (11).

$$f = (1-\omega^2 CL)^{-2}|j|^2 \quad (11)$$

In the formula (11), vector notation is omitted since a current flowing through a noise source is one. When $\omega^2 CL=1$, the objective function f is maximum. This phenomenon is called resonance. When the maximum C meeting the conditions of the formulae (8) and (9) meets $\omega^2 CL=1$, the noise is optimized by decreasing the capacity C. This situation is opposite to that in the first example. In the first example, the noise has been optimized as the capacity C is greater.

In view of the aforementioned two simple examples, the optimization for noises in this preferred embodiment will be described below.

First, an objective function f is transformed by a technique described in a literature 3 (Peter Feldmann et al., "Circuit noise evaluation by Pade approximation based model-reduction techniques", 1997 International Conference on Computer Aided Design, pp 132–138, 1997).

$$\vec{p} = (1-sCH_{II})^{-1}\vec{j}, \quad \vec{q} = (1+sH_{II}^+C)^{-1}H_{0I}^+H_{0I}\vec{p} \quad (12)$$

If the above formula (12) is defined to be rewritten, the following formula (13) can be obtained.

$$\begin{bmatrix} -H_{0l}^+ H_{0l} & 1+sH_{ll}^+C \\ 1-sCH_{ll} & 0 \end{bmatrix} \begin{bmatrix} \vec{p} \\ \vec{q} \end{bmatrix} = \begin{bmatrix} 0 \\ \vec{j} \end{bmatrix} \quad (13)$$

In this case, the objective function f can be expressed by the following formula (14).

$$f = \vec{j}^+ \cdot \vec{q} \quad (14)$$

The transformed objective function f is expressed by the formula (14). If vectors p, q are derived from the formula (13) to be substituted for the formula (14), the objective function f can be derived. If the approximation described in the literature 2 is used, the vectors p, q can be efficiently derived from the formula (13).

Then, a differential coefficient of the objective function f with respect to C is derived.

By varying the formulae (13) and (14) with respect to C, a variation $\delta f$ in the objective function f when the capacity C varies by a very small amount $\delta C$ can be expressed by the following formula (15).

$$\delta f = [\vec{p}^+ \ \vec{q}^+] \begin{bmatrix} o & sH_{ll}^+\delta C \\ -s\delta C H_{ll} & 0 \end{bmatrix} \begin{bmatrix} \vec{p} \\ \vec{q} \end{bmatrix} \quad (15)$$

If $\delta C_{kk}=1$ and $\delta C_{jj}=0$ ($j \neq k$) are put in the formula (15), a differential coefficient $d_{ckk}f$ of the variation $\delta f$ with respect to the capacity C can be obtained.

Figure 2:
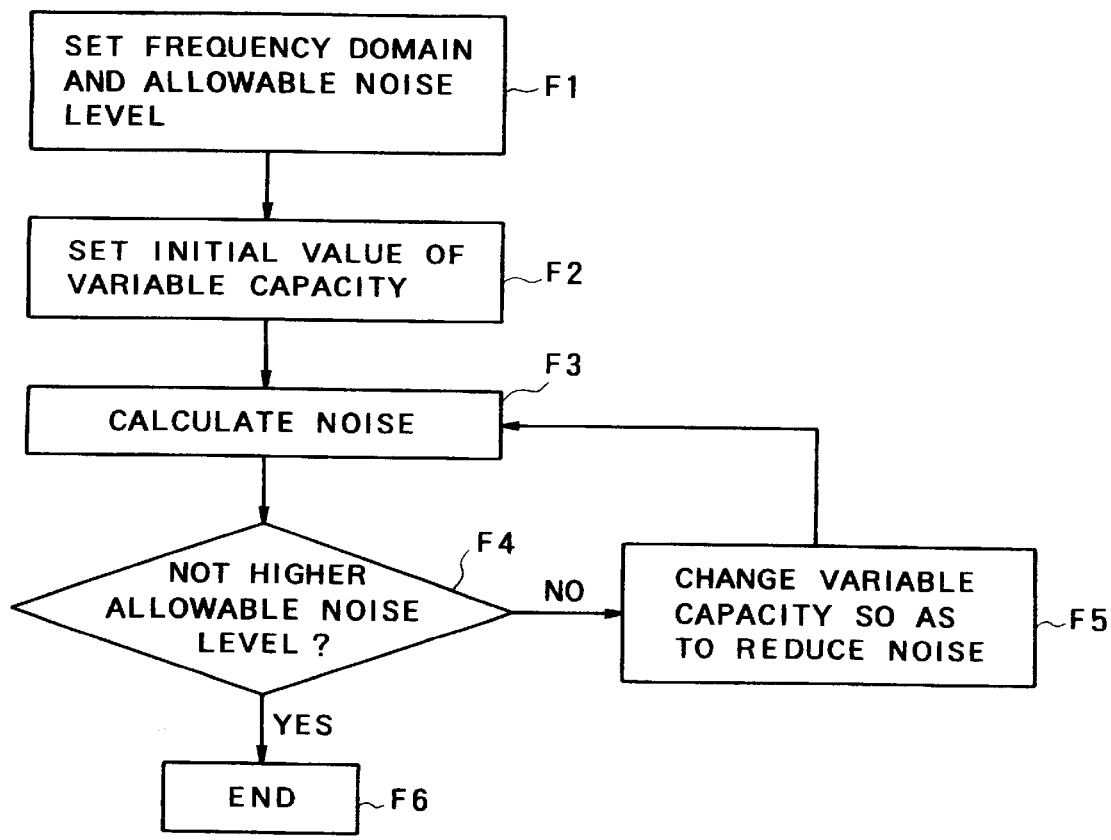
FIG. 2 is a flow chart showing an algorithm for deriving a capacity to optimize noises.

Referring to FIG. 2, an algorithm for deriving a capacity C for optimizing noises will be described.

① A frequency domain for optimizing noises and an allowable noise level with respect to each of frequencies are defined to be stored in the storage part 4 (see step F1 in FIG. 2).

② An initial value of a diagonal matrix C expressing a variable capacity is set in the storage part 4 using input means (not shown) (see step F2 in FIG. 2).

③ Vectors p, q are expressed as a function of s by the noise optimizing part 8 using the formula (13) for the given diagonal matrix C (see step F3 in FIG. 2).

④ An objective function f is derived by the noise optimizing part 8 using the formula (14) (see step F3 in FIG. 2).

⑤ It is determined by the noise optimizing part 8 whether the objective function f is not higher than an allowable level in the considered frequency domain (see step F4 in FIG. 2). When the objective function f is not higher than the allowable level, a capacity at this time is outputted as the optimum capacity from the output part 10 (see step F6 in FIG. 2).

⑥ When the objective function f exceeds the allowable level, a differential coefficient $d_cf$ of the objective function f with respect to C is derived by the noise optimizing part using the formula (15) (see step F5 in FIG. 2).

⑦ In the considered frequency domain, the differential coefficient of the objective function f with respect to C is weighted to be equalized by the noise optimizing part 8 (see step F5).

⑧ The diagonal matrix C of the capacity is varied by the noise optimizing part 8 by $\delta C$ in a direction opposite to the weighted and equalized differential coefficient $<d_cf>$ of f (see step F5). At this time, the magnitude of $\delta C$ is selected so that $C+\delta C$ meets the formulae (8) and (9).

⑨ The diagonal matrix C is updated to $C+\delta C$ by the noise optimizing part 8. Then, the routine returns to ③, and the above steps are repeated (see step F5).

The weighted mean $<d_cf>$ of the differential coefficient of the objective function f with respect to C in ⑦ of the above algorithm is defined by the following formula (16).

$$<d_cf> = \Sigma w(s) \times d_cf(s) \quad (16)$$

wherein the sum with respect to S is the sum of frequencies in the frequency domain, and the vector $d_cf(s) = (d_{c11}f(s), \ldots, d_{cmm}f(s))$ is a differential coefficient vector of the objective function f with respect to C at a frequency s. A weight function $w(s)$ with respect to the frequency s is defined by the following formula (17).

$$w(s) = \begin{cases} f(s) - f_0(s) & (f(s) > f_0(s)) \\ 0 & (f(s) \leq f_0(s)) \end{cases} \quad (17)$$

wherein $f_u(s)$ is an allowable noise level at the frequency s. The value of the weight function defined by the formula (17) increases as it exceeds the allowable noise level. The formula (17) is an example of the definition of the weight function, and other definitions may be used. In general, the value of the weight function increases as it exceeds the allowable noise level.

As described above, according to this preferred embodiment, it is possible to reduce undesired radiation generated from an LSI. Thus, the following advantages are expected.

(1) It is possible to stably use an equipment, which affects the user's life if noises generate, such as a medical equipment and an apparatus of an airplane.

(2) Since the countermeasure against noises is automated, it is not required to take the countermeasure against noises by manual operation, so that it is possible to reduce a design period.

(3) As a result of (2), it is possible to supply an inexpensive and stable LSI, so that the available LSI range expands.

Furthermore, while noises have been optimized by adding capacitors to noise sources in this preferred embodiment, noises may be optimized by adding inductances and resistors in addition to the capacitors.

As described above, according to the present invention, it is possible to reduce undesired radiation generated from an LSI.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A system for reducing undesired radiation generated from an LSI, said system comprising:

first storage means for storing a circuit connection information for said LSI and a current waveform of an undesired radiation source of said LSI;

transfer function calculating means for calculating a transfer function of undesired radiation, which is transmitted from an undesired radiation source in said LSI to a power source terminal connected to the outside of said LSI, on the basis of said circuit connection information and said current waveform;

second storage means for storing a constraint on an impedance added in the vicinity of said undesired radiation source, and an allowable level of undesired radiation at said power source terminal; and undesired radiation optimizing means for calculating an impedance, which causes said undesired radiation at said power source terminal to be less than or equal to said allowable level, using said transfer function under said constraint.

2. An undesired radiation reducing system as set forth in claim 1, wherein said impedance added in the vicinity of said undesired radiation source is a capacitor.

3. An undesired radiation reducing system as set forth in claim 2, wherein said undesired radiation optimizing means derives a relationship between a current vector of said undesired radiation source and a current vector flowing through said power source terminal, and derives undesired radiation so that an objective function, which is an absolute value of said current vector flowing through said power source terminal, is minimum under said constraint.

4. An undesired radiation reducing system as set forth in claim 3, wherein said undesired radiation optimizing means derives a differential of said objective function with respect to said added capacitor, and derives undesired radiation so that said differential is minimum under said constraint.

5. An undesired radiation reducing system as set forth in claim 4, wherein said differential is weighted by a weighting factor determined by said allowable level.

6. A method for reducing undesired radiation generated from an LSI, said method comprising:

a first step of deriving a transfer function of undesired radiation, which is transmitted from an undesired radiation source in said LSI to a power source terminal connected to the outside of said LSI, on the basis of a circuit connection information for said LSI and a current waveform of said undesired radiation source of said LSI;

a second step of setting a constraint on an impedance added in the vicinity of said undesired radiation source, an allowable level of undesired radiation at said power source terminal, and a frequency range to be considered;

a third step of deriving undesired radiation at said power source terminal under said constraint;

a fourth step of determining whether said undesired radiation derived at said third step is not higher than said allowable level in said frequency range; and a fifth step of changing said added impedance so as to reduce said undesired radiation to repeat said third and fourth steps when said derived undesired radiation exceeds said allowable level, and outputting said added impedance when said derived undesired radiation is not higher than said allowable level.

7. An undesired radiation reducing method as set forth in claim 6, wherein said impedance added in the vicinity of said undesired radiation source is a capacitor.

* * * * *